United States Patent [19]

Springthorpe

[11] Patent Number: 4,493,287

[45] Date of Patent: Jan. 15, 1985

[54] DIFFUSION EQUIPMENT

[75] Inventor: Anthony J. Springthorpe, Richmond, Canada

[73] Assignee: Northern Telecom Limited, Montreal, Canada

[21] Appl. No.: 446,441

[22] Filed: Dec. 3, 1982

[51] Int. Cl.³ ............................................. C23C 13/08
[52] U.S. Cl. .................................... 118/719; 118/726; 118/733; 118/900
[58] Field of Search ............... 118/900, 727, 729, 726, 118/719, 733; 156/606

[56] References Cited

U.S. PATENT DOCUMENTS

| | | | |
|---|---|---|---|
| 3,441,000 | 4/1969 | Burd et al. | 118/900 X |
| 4,067,697 | 1/1978 | Polaschegg | 118/733 X |
| 4,312,294 | 1/1982 | Satoh | 118/733 |

OTHER PUBLICATIONS

Silvestri, "App. for the Introduction of Substrates into a Vapor Deposition System", IBM Tech. Disclosure Bulletin, vol. 8, No. 5, Oct. 1965, pp. 708–709.

Primary Examiner—John D. Smith
Assistant Examiner—Bernard F. Plantz
Attorney, Agent, or Firm—Stuart L. Wilkinson

[57] ABSTRACT

To secure accurate control over rapid diffusion such as the diffusion of zinc into gallium arsenide, the source and slices to be processed are isolated from one another during an initial warm-up period. This is done using one vessel for the crystal slice and a second vessel for the source. The source vessel initially blocks an opening in the slice vessel while the source and slice are brought to the desired diffusion temperature. The source vessel is then slid through the opening to a diffusing position in which a trailing part of the source vessel again plugs the opening in the slice vessel and in which an open part of the source vessel is now in the interior of the slice vessel. Use of this arrangement avoids the uncontrolled diffusion which occurs in current diffusion capsules during initial heating of the capsule.

8 Claims, 2 Drawing Figures

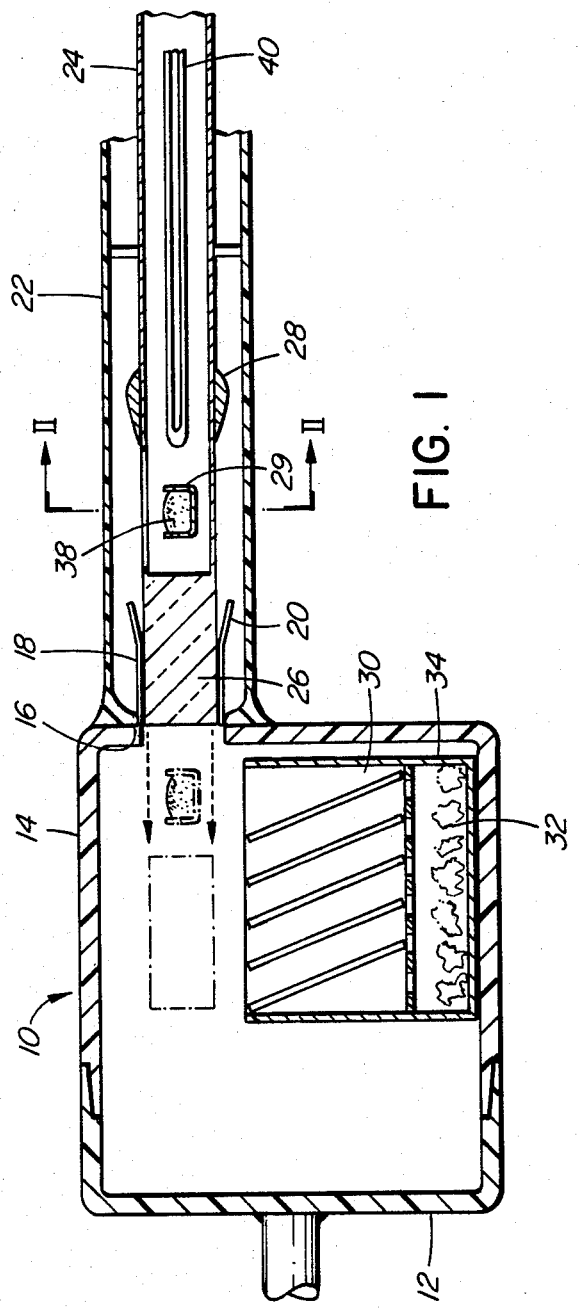
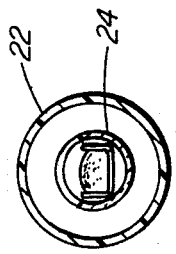

DIFFUSION EQUIPMENT

This invention relates to diffusion apparatus for diffusing a vapour such as zinc into a semiconductor slice such as one of gallium arsenide.

One of the major problems associated with the diffusion of zinc into gallium arsenide and other III–V compounds is obtaining exact control of the depth of diffusion. This is very important in the development of shallow junction devices. Since the diffusion coefficient is exponentially dependent on temperature, and diffusion depth is dependent on the square root of time close control of both the diffusion time and temperature are required. In the present box-diffusion technique, a single vessel is used. The source and slice are placed within the vessel or capsule, the interior of the capsule is flushed out with a neutral gas such as nitrogen, and, after sealing the vessel, it is heated to the diffusion temperature. Unfortunately, the time taken to reach that temperature is quite long and for shallow diffusions is comparable to the total diffusion time. During this warm-up period significant uncontrolled diffusion can take place.

To avoid this there is proposed according to the present invention apparatus for use in diffusing a first material into a second material at high temperature, the apparatus comprising a first vessel having an opening therein, a second vessel, and a third vessel shaped to permit sliding thereof through the opening into the first vessel, a leading part of the third vessel being a close fit within the opening, a trailing part of the third vessel being a close fit within the opening and an intermediate part of the third vessel having an opening therein.

Preferably the opening in the first vessel is circular and the third vessel is essentially tubular. The leading part of the third vessel can be a solid cylindrical plug.

The first vessel can have a tubular flange defining the opening, the flange belled out at an outer end to accept an appropriately shaped formation on the trailing part of the third vessel, the belled out part and the tapered formation together forming a sealing cone joint when the third vessel is pushed through the opening.

In order to provide adequate space within the first vessel to accept a large or several crystal slices supported by the first vessel, the opening in the first vessel is preferably near the top of one of the vessel side walls.

The tubular flange defining the opening in the first vessel can itself be surrounded by a relatively longer second tube, acting as a second vessel, the tubes being substantially symmetrical. The second tube or second vessel can function to support the third vessel as it is slid into and out of the first vessel.

The components of the apparatus are preferably made of high quality silica.

According to another aspect of the invention in a method of diffusing a first material into a second material at high temperature the steps of heating the source material and a slice into which diffusion is to take place to a desired diffusion temperature while the source and the slice are isolated from one another to prevent diffusion and, following attainment of the desired diffusion temperature introducing a vessel containing one of the source and slice into a vessel containing the other of the source and slice through an opening in the larger vessel, the smaller vessel also having an opening to allow diffusion species to pass to the slice when the vessels are so arranged.

An embodiment of the invention will now be described by way of example with reference to the accompanying drawings in which:

FIG. 1 shows a longitudinal section of diffusion apparatus according to the invention; and FIG. 2 shows a cross-section on the line II—II of FIG. 1.

Referring in detail to the Figures a main diffusion chamber is defined by a box or vessel 10 formed from a pair of matched silica cones 12 and 14. The capsule has an opening 16 within which a tube 18 is fused, the tube having a belled outer end 20. Concentric with the tube 18 and also fused to the vessel 14 is an outer silica tube 22 acting as a second vessel. Riding on the inside of the tube 22 is a smaller bore silica tube 24 to a leading end of which is fused a short solid plug 26 and to a trailing part of which is fused a male cone 28. The space between the male cone 28 and the plug 24 is sufficient to accommodate a diffusion boat or bucket 29 containing a diffusion source of, for example, zinc. As shown more clearly in FIG. 2, a region of the tube 22 between the cone and the plug has an opening 30. The tube 24 can be moved into the vessel 10 to the position shown by the chain line. In this position the plug no longer blocks the opening 16, the source bucket is within the chamber of vessel 10, and the cone joint between mouth 20 and formation 28 is made.

To carry out a zinc diffusion of gallium arsenide, gallium arsenide slices 32 to be diffused together with polycrystalline gallium arsenide 33 are placed in a silica boat 34 and this is positioned within the box or capsule 10. The zinc diffusion source 38 is placed inside the source bucket 29 which is located within the tube 24 between the plug 26 and the formation 28. At this point the diffusion box 10 and the diffusion source 38 within bucket 29 can be completely isolated.

The furnace tube (not shown) is then sealed and a flushing gas such as nitrogen is circulated around the capsule 10 for 30 minutes to eliminate traces of oxygen or other impurity. The main diffusion box 10 is then closed by making the joint between vessel parts 12 and 14 and a hot furnace within which the main diffusion box is mounted is turned on. At this stage the diffusion boat 29 is still out of the hot zone of the furnace.

After the gallium arsenide slices 30 attain the desired diffusion temperature, the tube 24 with the diffusion source 38 in place is pushed into the hot zone until the solid plug 26 seals off the diffusion box. At this stage even though the slices 32 are at high temperature and the zinc source 38 is in the process of being heated, no zinc vapour can reach the diffusion slices.

When the zinc source reaches the desired diffusion temperature as measured by the thermocouple 40 of the tube 24 is pushed forwardly so that the plug passes into the box 10 and the cone 28/26 is made. At this stage the zinc bucket 29 is within the main box 10 and the zinc vapour is free to escape into the main box through the opening 30.

The diffusion is allowed to proceed for the desired time. For example a zinc diffusion to a depth of 0.5 $\mu$m into gallium arsenide takes about 15 minutes, at 600° C.

To halt the diffusion, the tube 24 is withdrawn to open the cone joint 28/26 and the equipment is removed from the furnace hot zone.

The important feature of the equipment is that it holds the source 38 and slices 30 isolated from one another until the desired diffusion temperature of both is reached. Other types of equipment enabling initial isolation followed by union of source and slice can be envisaged but it is believed that the motion of two vessels, one of which can be readily slid into the other in order to unite source and substrate is the simplest. Clearly the larger vessel could have the source and the smaller one the slice if so desired.

What is claimed is:

1. Apparatus for use in diffusing a first material into a second material at high temperature, the apparatus comprising a first refractory vessel defining a first chamber for housing a semiconductor wafer, a second refractory vessel defining a second chamber, and a third refractory vessel defining a third chamber for housing a diffusion source, the first and second vessels having an opening therebetween, the third refractory vessel shaped to permit sliding thereof through the opening from the second vessel into the first vessel, a leading part of the third vessel being a close sliding fit within the opening, a trailing part of the third vessel having a positive sealing abutment with the opening, and an intermediate part of the third vessel having an aperture therein whereby with the leading part of the third refractory vessel within the opening, the third chamber is positioned inside the second chamber and is substantially isolated from the first chamber so that when the apparatus is heated diffusion species from the diffusion source cannot contact the wafer, and with the trailing part of the third vessel positively sealingly abutting the opening, the first chamber is united with the second chamber through said aperture so that diffusion species from the source can contact the wafer.

2. Apparatus as claimed in claim 1, in which the opening in the first vessel is circular and the third vessel is essentially tubular.

3. Apparatus as claimed in claim 1, in which the leading part of the third vessel is a solid cylindrical plug.

4. Apparatus as claimed in claim 2 in which the first vessel has a tubular flange defining the opening, the flange being belled out at an outer end to accept a correspondingly shaped formation on the trailing part of the third vessel, the belled out end and the shaped formation forming said positive sealing abutment.

5. Apparatus as claimed in claim 1, in which the opening in the first vessel is near the top of a side wall of the first vessel.

6. Apparatus as claimed in claim 4 in which the second vessel is cylindrical, concentric with, and relatively longer than the tubular flange.

7. Apparatus as claimed in claim 6 in which the second chamber is defined internally by the third vessel, the second vessel functions to support the trailing part of the third vessel.

8. Apparatus as claimed in claim 1, in which components of the apparatus are made of high quality silica.

* * * * *